(12) United States Patent
Lee

(10) Patent No.: US 8,840,958 B2
(45) Date of Patent: Sep. 23, 2014

(54) COMBINED INJECTION MODULE FOR SEQUENTIALLY INJECTING SOURCE PRECURSOR AND REACTANT PRECURSOR

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 79 days.

(21) Appl. No.: 13/368,265

(22) Filed: Feb. 7, 2012

(65) Prior Publication Data

US 2012/0207926 A1     Aug. 16, 2012

Related U.S. Application Data

(60) Provisional application No. 61/442,778, filed on Feb. 14, 2011.

(51) Int. Cl.
   *C23C 16/455*   (2006.01)
   *C23C 16/40*    (2006.01)
   *C23C 16/44*    (2006.01)

(52) U.S. Cl.
   CPC ......... *C23C 16/45548* (2013.01); *C23C 16/403* (2013.01); *C23C 16/4412* (2013.01)
   USPC ....................................... 427/248.1; 118/715

(58) Field of Classification Search
   None
   See application file for complete search history.

(56) References Cited

U.S. PATENT DOCUMENTS

| | | |
|---|---|---|
| 4,293,326 A | 10/1981 | Terneu et al. |
| 4,834,020 A | 5/1989 | Bartholomew et al. |
| 4,891,247 A | 1/1990 | Shamshoian |
| 5,063,951 A | 11/1991 | Bard et al. |
| 5,122,391 A | 6/1992 | Mayer |
| 5,136,975 A | 8/1992 | Bartholomew et al. |
| 5,275,668 A | 1/1994 | Dell et al. |
| 5,286,295 A | 2/1994 | Sauvinet et al. |
| 5,482,557 A | 1/1996 | Kanai et al. |
| 5,683,516 A | 11/1997 | DeDontney et al. |
| 5,725,668 A | 3/1998 | Foster et al. |
| 5,879,459 A | 3/1999 | Gadgil et al. |
| 5,935,647 A | 8/1999 | DeDontney et al. |

(Continued)

FOREIGN PATENT DOCUMENTS

| | | |
|---|---|---|
| CN | 1436602 A | 8/2003 |
| EP | 0499524 A1 | 8/1992 |

(Continued)

OTHER PUBLICATIONS

European Extended Search Report, European Application No. 10786646.9, Nov. 29, 2012, 17 pages.

(Continued)

*Primary Examiner* — Joseph Miller, Jr.
(74) *Attorney, Agent, or Firm* — Fenwick & West LLP

(57) ABSTRACT

Performing atomic layer deposition using a combined injector that sequentially injects source precursor and reactant precursor onto a substrate. The source precursor is injected into the injector via a first channel, injected onto the substrate and then discharged through a first exhaust portion. The reactant precursor is then injected into the injector via a second channel separate from the first channel, injected onto the substrate and then discharged through a second exhaust portion separate from the first exhaust portion. After injecting the source precursor or the reactant precursor, a purge gas may be injected into the injector and discharged to remove any source precursor or reactant precursor remaining in paths from the first or second channel to the first or second exhaust portion.

11 Claims, 9 Drawing Sheets

(56) References Cited

U.S. PATENT DOCUMENTS

| | | |
|---|---|---|
| 6,022,414 A | 2/2000 | Miller et al. |
| 6,079,353 A | 6/2000 | Leksell et al. |
| 6,083,355 A | 7/2000 | Spence |
| 6,143,077 A | 11/2000 | Ikeda et al. |
| 6,195,504 B1 | 2/2001 | Horie et al. |
| 6,200,389 B1 | 3/2001 | Miller et al. |
| 6,206,972 B1 | 3/2001 | Dunham |
| 6,354,109 B1 | 3/2002 | Boire et al. |
| 6,416,822 B1 | 7/2002 | Chiang et al. |
| 6,435,428 B2 | 8/2002 | Kim et al. |
| 6,521,048 B2 | 2/2003 | Miller et al. |
| 6,539,891 B1 | 4/2003 | Lee et al. |
| 6,569,501 B2 | 5/2003 | Chiang et al. |
| 6,634,314 B2 | 10/2003 | Hwang et al. |
| 6,656,284 B1 | 12/2003 | Hwang et al. |
| 6,812,157 B1 | 11/2004 | Gadgil |
| 6,824,816 B2 | 11/2004 | Aaltonen et al. |
| 6,890,386 B2 | 5/2005 | DeDontney et al. |
| 6,926,572 B2 | 8/2005 | Park et al. |
| 6,972,055 B2 | 12/2005 | Sferlazzo |
| 7,087,119 B2 | 8/2006 | Sandhu |
| 7,118,779 B2 | 10/2006 | Verghese et al. |
| 7,384,680 B2 | 6/2008 | Bi et al. |
| 7,455,884 B2 | 11/2008 | Sandhu |
| 7,494,545 B2 | 2/2009 | Lam et al. |
| 7,615,486 B2 | 11/2009 | Yoon et al. |
| 7,754,013 B2 | 7/2010 | Granneman |
| 7,914,847 B2 | 3/2011 | Verghese et al. |
| 7,943,527 B2 | 5/2011 | Kumar et al. |
| 7,981,472 B2 | 7/2011 | Dalton et al. |
| 2003/0072881 A1 | 4/2003 | Yang et al. |
| 2003/0198587 A1 | 10/2003 | Kaloyeros et al. |
| 2004/0067641 A1 | 4/2004 | Yudovsky |
| 2004/0129212 A1 | 7/2004 | Gadgil et al. |
| 2004/0216668 A1* | 11/2004 | Lindfors et al. ............ 118/715 |
| 2004/0265195 A1 | 12/2004 | Lee |
| 2005/0084610 A1* | 4/2005 | Selitser .................. 427/248.1 |
| 2005/0092247 A1 | 5/2005 | Schmidt et al. |
| 2006/0183301 A1 | 8/2006 | Yeom et al. |
| 2007/0095286 A1 | 5/2007 | Baek et al. |
| 2008/0124945 A1* | 5/2008 | Miya et al. .................. 438/778 |
| 2008/0260940 A1 | 10/2008 | Yoon et al. |
| 2008/0260967 A1 | 10/2008 | Yoon et al. |
| 2009/0017190 A1 | 1/2009 | Sferlazzo et al. |
| 2009/0047775 A1 | 2/2009 | Yamazaki et al. |
| 2009/0064932 A1 | 3/2009 | Kim et al. |
| 2009/0068849 A1 | 3/2009 | Endo et al. |
| 2009/0081885 A1* | 3/2009 | Levy et al. ................. 438/778 |
| 2009/0098276 A1 | 4/2009 | Burrows et al. |
| 2009/0130858 A1 | 5/2009 | Levy |
| 2009/0165715 A1* | 7/2009 | Oh ......................... 118/723 R |
| 2009/0304924 A1* | 12/2009 | Gadgil ...................... 427/255.5 |
| 2009/0320749 A1 | 12/2009 | Yoon et al. |
| 2010/0037820 A1 | 2/2010 | Lee |
| 2010/0041213 A1 | 2/2010 | Lee |
| 2010/0055347 A1 | 3/2010 | Kato et al. |
| 2010/0124618 A1 | 5/2010 | Kobayashi et al. |
| 2010/0132615 A1 | 6/2010 | Kato et al. |
| 2010/0140802 A1 | 6/2010 | Matsumoto et al. |
| 2010/0221426 A1 | 9/2010 | Sferlazzo |
| 2010/0310771 A1 | 12/2010 | Lee |
| 2011/0005681 A1* | 1/2011 | Savas et al. ............... 156/345.33 |
| 2011/0076421 A1 | 3/2011 | Lee |
| 2012/0021252 A1 | 1/2012 | Lee |
| 2012/0027953 A1 | 2/2012 | Lee |
| 2012/0196050 A1 | 8/2012 | Vermeer et al. |
| 2012/0225204 A1 | 9/2012 | Yudovsky |
| 2012/0225206 A1 | 9/2012 | Yudovsky |
| 2012/0225207 A1 | 9/2012 | Yudovsky |
| 2013/0260539 A1 | 10/2013 | Lee |

FOREIGN PATENT DOCUMENTS

| | | |
|---|---|---|
| EP | 2159304 A1 | 3/2010 |
| EP | 2360293 A1 | 8/2011 |
| FR | 2736632 A1 | 1/1997 |
| JP | S62-081018 A | 4/1987 |
| JP | H01-096924 A | 4/1989 |
| JP | H01-223724 A | 9/1989 |
| JP | H02-187018 A | 7/1990 |
| JP | H04-092414 A | 3/1992 |
| JP | H09-064000 A | 3/1997 |
| JP | 10-507994 | 8/1998 |
| JP | H11-285882 | 10/1999 |
| JP | 2001-357780 A | 12/2001 |
| JP | 2002-339075 A | 11/2002 |
| JP | 2003-174019 A | 6/2003 |
| JP | 2003-324070 | 11/2003 |
| JP | 2004-010949 A | 1/2004 |
| JP | 2005-089781 A | 4/2005 |
| JP | 2005-116898 | 4/2005 |
| JP | 2007-266093 A | 10/2007 |
| JP | 2008-108895 A | 5/2008 |
| JP | 2009-531535 A | 9/2009 |
| KR | 10-2001-0040561 | 5/2001 |
| KR | 10-2002-0078804 | 10/2002 |
| KR | 10-2002-0083564 A | 11/2002 |
| KR | 10-2003-0086056 A | 11/2002 |
| KR | 10-2004-0016779 A | 2/2004 |
| KR | 10-2005-0015931 A | 2/2005 |
| KR | 10-0542736 | 1/2006 |
| KR | 10-631972 A | 8/2006 |
| KR | 10-0622609 B1 | 9/2006 |
| KR | 10-2006-104230 A | 10/2006 |
| KR | 10-2006-0117607 | 11/2006 |
| KR | 10-0760428 A | 11/2006 |
| KR | 10-0673211 B1 | 1/2007 |
| KR | 10-2007-0076955 A | 7/2007 |
| KR | 10-2007-0096770 A | 10/2007 |
| KR | 10-2007-0101127 A | 10/2007 |
| KR | 10-2007-0101360 A | 10/2007 |
| KR | 10-0791677 B1 | 1/2008 |
| KR | 10-0840897 B1 | 6/2008 |
| KR | 10-2008-0067042 | 7/2008 |
| WO | WO 99/39144 A1 | 8/1999 |
| WO | WO 2006/054854 A1 | 5/2006 |
| WO | WO 2007/106076 A2 | 9/2007 |
| WO | WO 2008/130369 A1 | 10/2008 |
| WO | WO 2009/042147 A1 | 4/2009 |
| WO | WO 2012/028776 A1 | 3/2012 |

OTHER PUBLICATIONS

PCT Written Opinion, PCT Application No. PCT/KR2010/001076, Sep. 27, 2010, 8 pages.
PCT International Search Report and Written Opinion, PCT Application No. PCT/US2010/037660, Aug. 3, 2010, 9 pages.
PCT International Search Report and Written Opinion, PCT/US2010/050358, Dec. 1, 2010, 10 pages.
PCT International Search Report and Written Opinion, PCT Application No. PCT/US11/45199, Dec. 6, 2011, 10 pages.
PCT International Search Report, PCT Application No. PCT/US12/24451, May 21, 2012, 12 pages.
U.S. Appl. No. 13/190,104, filed Jul. 25, 2011, Inventor: Sang In Lee.
"Atomic Layer Deposition," Cambridge NanoTech Inc., 2005, 40 pages, [Online] Retrieved from the Internet<URL:http://www.pascaltechnologies.com/files%5CTech.Docs%5CAtomic%20Layer%20Deposition%20Tutorial.pdf>.
Puurunen, R.L. et al., "Surface Chemistry of Atomic Layer Deposition: A Case Study for the Trimethylaluminum/Water Process," Journal of Applied Physics, 2005, pp. 121301-1-121301-52, vol. 97.
European Examination Report, European Application No. 10821080.8, Apr. 17, 2013, 11 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.

(56) References Cited

OTHER PUBLICATIONS

Japanese Office Action, Japanese Application No. 2012-532219, Sep. 10, 2013, 7 pages.
U.S. Appl. No. 13/904,825, filed May 29, 2013, Inventor: Sang In Lee.
European Examination Report, European Patent Application No. 10786646.9, Oct. 24, 2013, 5 pages.
Taiwan Office Action, Taiwan Application No. 100126066, Oct. 8, 2013, 14 pages.
Taiwan Office Action, Taiwan Application No. 101104784, Feb. 14, 2014, 12 pages.

* cited by examiner

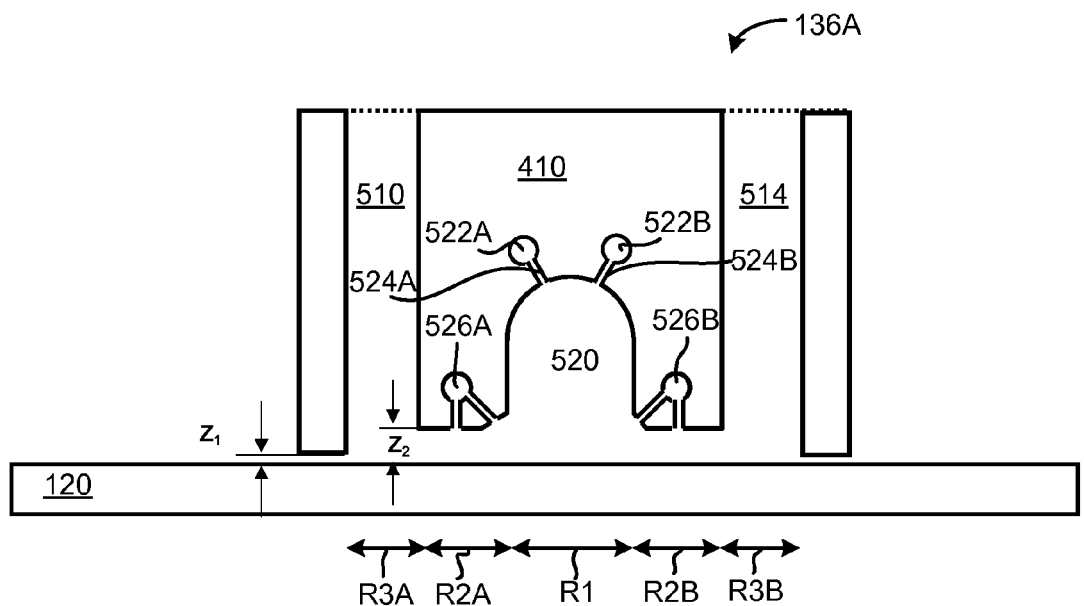
FIG. 5
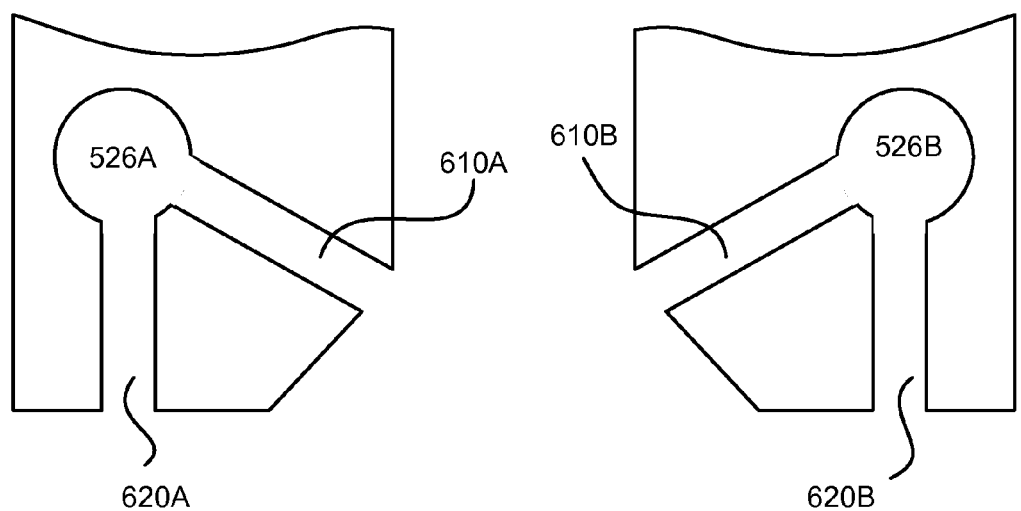
FIG. 6A
FIG. 6B

- ◎ TMA molecule
- ⊘ H₂O molecule [ or (OH) or O* radical]
- ● Al₂O₃ monolayer

COMBINED INJECTION MODULE FOR SEQUENTIALLY INJECTING SOURCE PRECURSOR AND REACTANT PRECURSOR

CROSS-REFERENCE TO RELATED APPLICATION

This application claims priority under 35 U.S.C. §119(e) to U.S. Provisional Patent Application No. 61/442,778, filed on Feb. 14, 2011, which is incorporated by reference herein in its entirety.

BACKGROUND

1. Field of Art

The present invention relates to depositing one or more layers of materials on a substrate using atomic layer deposition (ALD).

2. Description of the Related Art

An atomic layer deposition (ALD) is a thin film deposition technique for depositing one or more layers of material on a substrate. ALD uses two types of chemical, one is a source precursor and the other is a reactant precursor. Generally, ALD includes four stages: (i) injection of a source precursor, (ii) removal of a physical adsorption layer of the source precursor, (iii) injection of a reactant precursor, and (iv) removal of a physical adsorption layer of the reactant precursor. ALD can be a slow process that can take an extended amount of time or many repetitions before a layer of desired thickness can be obtained. Hence, to expedite the process, a vapor deposition reactor with a unit module (so-called a linear injector), as described in U.S. Patent Application Publication No. 2009/0165715 or other similar devices may be used to expedite ALD process. The unit module includes an injection unit and an exhaust unit for a source material (a source module), and an injection unit and an exhaust unit for a reactant (a reactant module).

A conventional ALD vapor deposition chamber has one or more sets of reactors for depositing ALD layers on substrates. As the substrate passes below the reactors, the substrate is exposed to the source precursor, a purge gas and the reactant precursor. The source precursor molecules deposited on the substrate reacts with reactant precursor molecules or the source precursor molecules are replaced with the reactant precursor molecules to deposit a layer of material on the substrate. After exposing the substrate to the source precursor or the reactant precursor, the substrate may be exposed to the purge gas to remove excess source precursor molecules or reactant precursor molecules from the substrate.

Conventionally, multiple reactors are used to increase the speed of deposition or to deposit different materials on the substrate. As the number of reactors increase, the type of materials and the speed of deposition can be increased. However, the increased number of reactors results in an increase in the cost of the deposition apparatus for performing the ALD.

SUMMARY

Embodiments relate to depositing a layer of material on a substrate by injecting a source precursor and a reactant precursor via the same injector. The source precursor is injected into a reaction chamber of the injector via a first channel formed in the injector. The substrate is exposed to the source precursor in the reaction chamber. Excess source precursor remaining after exposure of the substrate to the injected source precursor is routed to a first exhaust portion formed in the injector. Reactant precursor is injected into the reaction chamber via a second channel formed in the injector. The substrate is exposed to the reactant precursor below the reaction chamber. Excess reactor precursor is routed to a second exhaust portion after exposure of the substrate to the injected reactor precursor. The second exhaust portion is separate from the first exhaust portion.

In one embodiment, a purge gas is injected into the reaction chamber via the first channel after injecting the source precursor into the reaction chamber. A purge gas is also injected into the reaction chamber via the second channel after injecting the reactant precursor into the reaction chamber.

In one embodiment, the excess source precursor is routed to the first exhaust portion by injecting a purge gas through a first purge gas channel formed in a portion of the injector adjacent to the second exhaust portion. The purge gas is injected via the first purge gas channel and a first perforation facing the first exhaust portion.

In one embodiment, the purge gas is injected towards the substrate via a second perforation facing the substrate.

In one embodiment, the source precursor is injected into the reaction chamber in the direction of the first exhaust portion.

In one embodiment, the excess reactant precursor is routed to the second exhaust portion by injecting a purge gas through a second purge channel formed in a portion of the injector adjacent to the first exhaust portion and a second perforation facing the second exhaust portion.

In one embodiment, the excess source precursor is routed to the first exhaust portion by closing a first shutter between the second exhaust portion and the reaction chamber. The excess reactant precursor is routed to the second exhaust portion by closing a second shutter between the first exhaust portion and the reaction chamber.

In one embodiment, the source precursor comprises Trimethylaluminium, the reactant source precursor comprises ozone, and the deposited material comprises $Al_2O_3$.

In one embodiment, a relative movement is caused between the injector and the substrate to deposit the material on different areas of the substrate.

Embodiments also relate to an injector for depositing a layer of material on a substrate by injecting a source precursor and a reactant precursor. The injector includes a body formed with a first channel, a second channel, a reaction chamber, and first and second exhaust portion. The first channel supplies a source precursor into the reaction chamber. The second channel supplies a reactant precursor into the reaction chamber. The reaction chamber is connected to the first channel and the second channel to receive the source precursor or the reactant precursor. The substrate exposed to the source precursor and the reactant precursor below the reaction chamber. The first exhaust portion is formed at a first side of the injector for discharging excess source precursor remaining after injecting the supplied source precursor onto the substrate. The second exhaust portion is formed at a second side opposite to the first side for discharging excess reactant precursor remaining after injecting the supplied reactant precursor onto the substrate.

BRIEF DESCRIPTION OF DRAWINGS

FIG. 5 is a cross sectional diagram illustrating the injector taken along line A-B of FIG. 4, according to one embodiment.

FIGS. 6A and 6B are partially enlarged diagrams of the injector of FIG. 5, according to one embodiment.

DETAILED DESCRIPTION OF EMBODIMENTS

Figure 1:
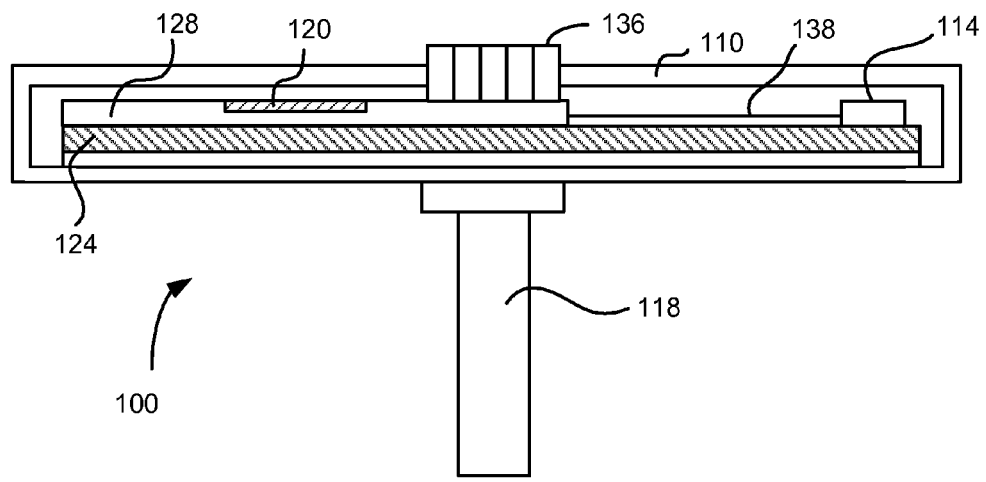
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to performing atomic layer deposition (ALD) using a combined injector that sequentially injects source precursor and reactant precursor onto a substrate. The source precursor is injected into the injector via a first channel, injected onto the substrate, and then discharged through a first exhaust portion. The reactant precursor is then injected into the injector via a second channel separate from the first channel, injected onto the substrate, and then discharged through a second exhaust portion separate from the first exhaust portion. After injecting the source precursor or the reactant precursor, a purge gas may be injected into the injector and discharged to remove any source precursor or reactant precursor remaining in paths from the first or second channel to the first or second exhaust portion. By providing separate paths for discharging the source precursor and the reactant precursor, particles are not formed in the paths for discharging the source precursor or the reactant precursor.

Figure 2:
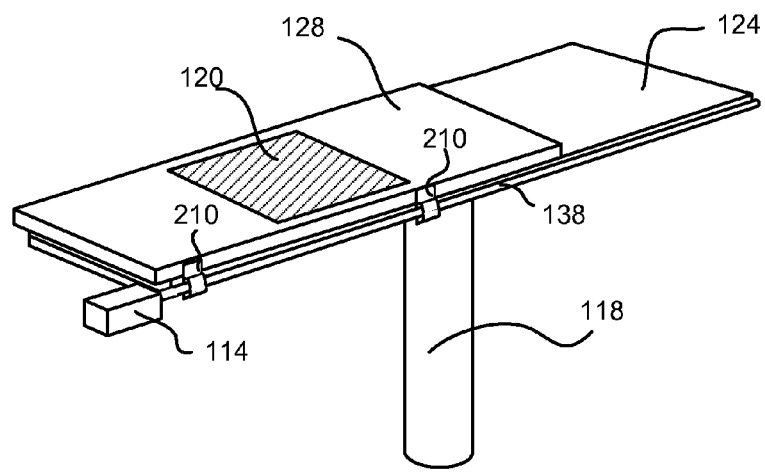
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and one or more reactors 136. The reactors 136 may include one or more of injectors and radical reactors. Each of the injectors injects source precursors, reactant precursors, purge gases or a combination of these materials onto the substrate 120.

The process chamber enclosed by the walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins that facilitate loading of the substrate 120 onto the susceptor 128 or dismounting of the substrate 120 from the susceptor 128.

In one embodiment, the susceptor 128 is secured to brackets 210 that moves across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3:
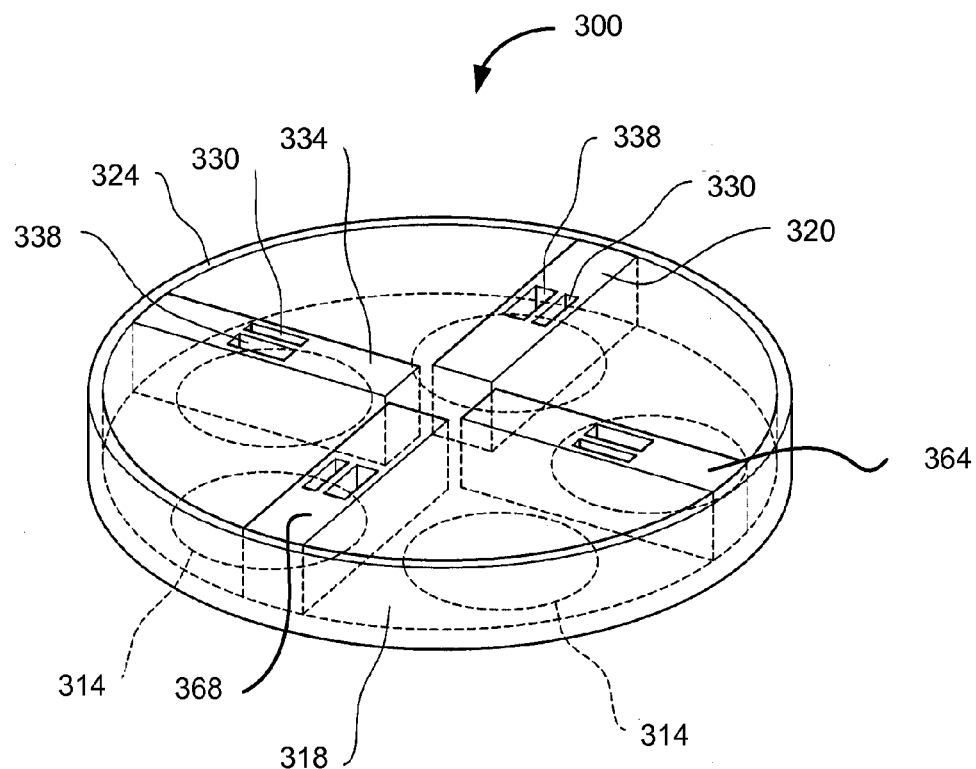
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320, 334, 364, 368, a susceptor 318, and a container 324 enclosing these components. The susceptor 318 secures the substrates 314 in place. The reactors 320, 334, 364, 368 are placed above the substrates 314 and the susceptor 318. Either the susceptor 318 or the reactors 320, 334, 364, 368 rotate to subject the substrates 314 to different processes.

One or more of the reactors 320, 334, 364, 368 are connected to gas pipes (not shown) to provide source precursor, reactor precursor, purge gas and/or other materials. The materials provided by the gas pipes may be (i) injected onto the substrate 314 directly by the reactors 320, 334, 364, 368, (ii) after mixing in a chamber inside the reactors 320, 334, 364, 368, or (iii) after conversion into radicals by plasma generated within the reactors 320, 334, 364, 368. After the materials are injected onto the substrate 314, the redundant materials may be exhausted through outlets 330, 338.

Embodiments as described herein may be use in the linear deposition device 100, the rotating deposition device 300 or other types of deposition device. Taking the examples of the linear deposition device 100 and the rotating deposition device 300, the substrate 120 (or 314) may undergo different sequences of processes by moving the substrate 120 (or 314) relative to the reactors in one direction and then in an opposite direction.

Figure 4:
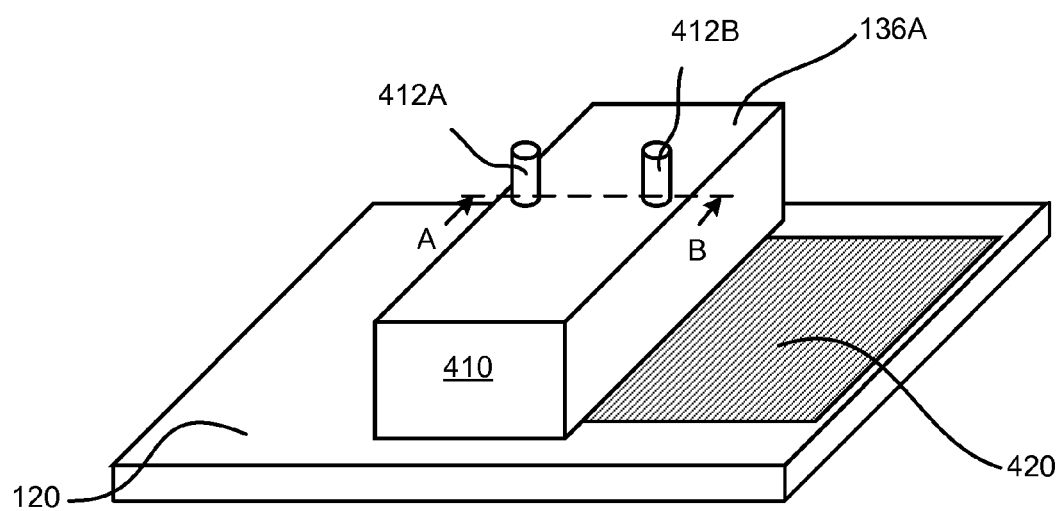
FIG. 4 is a diagram illustrating an injector according to one embodiment.

FIG. 4 is a diagram illustrating an injector 136A according to one embodiment. The injector 136A has a body 410 that is connected to discharge pipes 412A, 412B. A plurality of channels, holes or slits and a reactor chamber are formed in the body 410 to inject source precursor, reactant precursor and purge gas onto the substrate 120. The injector 136A includes mechanisms for routing excess source precursor and excess reactant precursor to different exhaust portions (refer to FIG. 5) that are connected to the discharge pipes 412A, 412B. Hence, each of the discharge pipes 412A, 412B carries one of the excess source precursor or the excess reactant precursor but not both precursors, as described below in detail with reference to FIG. 5. The excess source precursor and the excess reactant precursor herein refer to source precursor and reactant precursor remaining after these materials are injected on the substrate 120.

The mechanism for routing the excess source precursor or the excess reactant precursor may include, among others, a gas injection channels in combination with slits or holes, and a mechanical shutter mechanism for closing a path to the discharge pipe 412A or 412B. Embodiments for such mechanisms are described below in detail with reference to FIGS. 6A, 6B, 11A and 11B. However, other embodiments may use different ways to close the path to the discharge pipe 412A or 412B.

The injector 136A advantageously enables deposition of layers 420 without moving the substrate 120. In one embodiment, the substrate 120 is moved horizontally (e.g., to the right or the left in FIG. 4) to perform ALD on different parts of the substrate 120. The ALD may be performed only on select portions of the substrate 120 (instead of an entire surface of the substrate 120), as described below in detail with reference to FIG. 10A.

FIG. 5 is a cross sectional diagram illustrating the injector 136A taken along line A-B of FIG. 4, according to one embodiment. In the body 410 of the injector 136A, exhaust portions 510, 514, gas channels 522A, 522B, slits or holes 524A, 524B, a reaction chamber 520, and purge gas channels 526A, 526B are formed. In one embodiment, source precursor is injected into the reaction chamber 520 via the gas channel 522A and slits/holes 524A. A reactant precursor is also injected into the reaction chamber 520 via the gas channels 522B and slits/holes 524B. Below the reaction chamber 520, the source precursor or the reactant precursor comes into contact with the substrate 120.

The source precursor and the reactant precursor are injected into the reaction chamber 520 sequentially with purge gases optionally cleaning out the reaction chamber 520 after each injection of the source precursor or the reactant precursor. In this way, reaction of the source precursor and the reactant precursor are prevented from occurring in the interior of the injector 136A. The reaction of the source precursor and the reactant precursor within the injector 136A may generate particles that block pathways or become contaminant for other processes. The source precursor and the reactant precursor travel via different routes except for the reaction chamber 520 to avoid undesirable interactions of the source precursor and the reactant within the injector 136A.

Inert gas (e.g., purge gas) may be injected towards the substrate 120 via the purge gas channels 526A, 526B. In one embodiment, the amount of gas injected into each of the purge gas channels 526A, 526B is varied depending on whether the source precursor or the reactant precursor is being injected into the reaction chamber 520, as described below in detail with reference to FIGS. 8A and 8B. Depending on the amount of gas injected via the purge gas channels 526A, 526B, the excess source precursor or the excess reactant precursor is routed to the exhaust portion 510 or 514.

As shown in FIG. 5, the substrate 120 is exposed to the source precursor and the reactant precursor in a reaction zone R1. Depending on the amount of gas injected at the time, a layer of the source precursor or the reactant precursor is deposited on the substrate 120 in constriction zones R2A, R2B. In the constriction zones R2A, R2B, the excess source precursor or the reactant precursor moves at a higher speed cue to a gap $Z_2$ compared to the reaction zone R1, and thereby removal of physisorbed source precursor or reactant precursor from the surface of the substrate 120 is facilitated. More complete removal of the physisorbed source precursor or the reactant precursor is achieved by purge gas injected after the injection of the source precursor or the reactant precursor.

Although there is a small gap $Z_1$ between the body 410 and the substrate 120, most of the excess source precursor or the excess reactant precursor is pumped out from the injector 136A via the exhaust portions 510, 514 due to the vacuum state created in the exhaust portions.

After injecting source precursor or reactant precursor via the channels 522A, 522B, purge gas is injected into the reaction chamber 520 and discharged via the exhaust portion 510, 514 to clear the reaction chamber 520 of the source precursor or the reactant precursor. Since the precursor molecules are discharged via the exhaust portions 510, 514, the source precursor or the reactant precursor do not become absorbed in the substrate 120 in exhaust zones R3A, R3B.

Mechanisms may be provided in the injector 136A to route the excess source precursor to one exhaust portion (e.g., exhaust portion 514) and the reactant precursor to the other exhaust portion (e.g., exhaust portion 510). FIGS. 6A and 6B are partially enlarged diagrams illustrating purge gas injection mechanism for routing the excess source precursor and the excess reactant precursor to the exhaust portions 510, 514, according to one embodiment.

FIG. 6A shows the purge gas channel 526A and perforations (e.g., slits or holes) 610A, 620A connected to the purge gas channel 526A. When a gas injected into the reaction chamber 520 is to be discharged through the exhaust portion 514, a larger amount of purge gas is injected via the purge gas channel 526A compared to the purge gas channels 526B. As the purge gas is provided to the purge gas channels 526A, part of the purge gas flows towards bottom right direction via holes/slits 610A and pushes the gas in the reaction chamber 520 towards the exhaust portion 514. A smaller amount of purge gas (or no purge gas) is injected into the purge gas channels 526, and hence, a flow of gas towards the exhaust portion 514 is formed. The remaining purge gas provided into the purge gas channels 526A flows downwards via 620A, forming a purge gas curtain that prevents the gas in the reaction chamber 520 from entering the exhaust portion 510.

To facilitate the discharge of the source precursor via the exhaust portion 514, the holes/slits 524A for injecting the source precursor into the reactor chamber 520 is slanted towards the restriction zone R2B. Since the source precursor is injected towards the restriction zone R2B, the source precursor will tend to discharge via the exhaust portion 514 even absent the purge gas injected via the purge gas channels 526A. By the combined action of the purge gas injected via the purge gas channel 526A and the orientation of the holes/slits 524A, most of the source precursor is discharged via the exhaust portion 514.

FIG. 6B shows the purge gas channel 526B and perforations (slits or holes) 610B, 620B connected to the purge gas channels 526B. The structure of the purge gas channel 526B and slits or holes 610B, 620B mirrors the structure of the purge gas channel 526A and slits or holes 610A, 620A. When a gas injected into the reaction chamber 520 is to be discharged through the exhaust portion 510, a larger amount of purge gas is injected via the purge gas channel 526B compared to the purge gas channel 526A. The principle of pushing the gas in the reaction chamber 520 to the exhaust portion 510 by the purge gas injected into the channel 526B is the same as the explanation on injection of the purge gas into the channels 526A. Part of the purge gas provided into the purge gas channels 526B flows downwards via 620B, forming a purge gas curtain that prevents the gas in the reaction chamber 520 from entering the exhaust portion 514.

The holes/slits 524B is also slanted toward the restriction zone R2A to facilitate the discharge of the excess reactant precursor via the exhaust portion 510.

Figure 7:
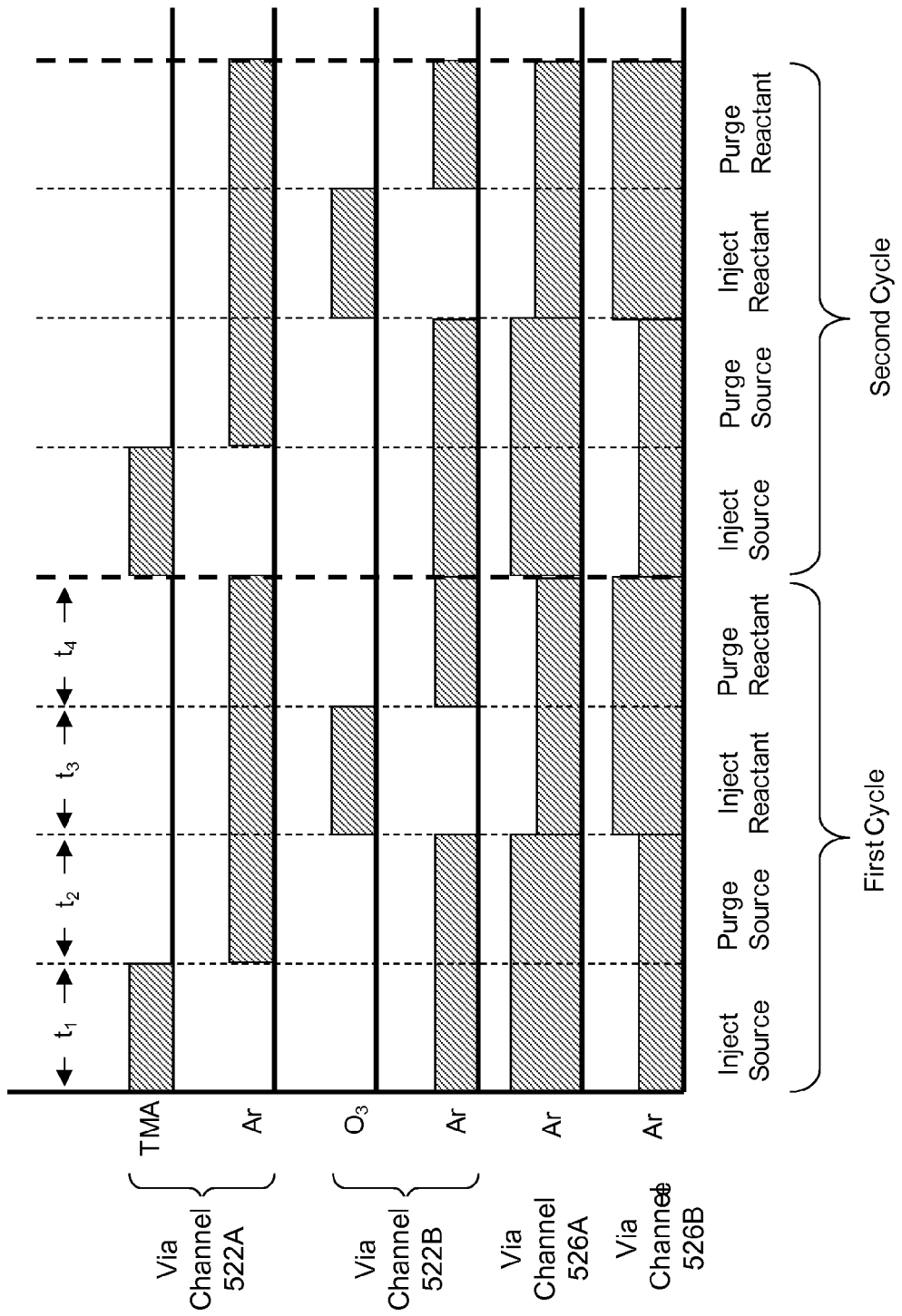
FIG. 7 is a timing diagram illustrating sequence of materials injected through the injector, according to one embodiment.

FIG. 7 is a timing diagram illustrating the sequence of materials injected through the injector, according to one embodiment. The embodiment of FIG. 7 relates to using Trimethylaluminium (TMA) as the source precursor and ozone ($O_3$) as the reactant precursor to form one or more layers of $Al_2O_3$ on the substrate 120. In the example of FIG. 7, two cycles of the same processes are repeated to deposit two layers of $Al_2O_3$ on the substrate 120.

Figure 8A:
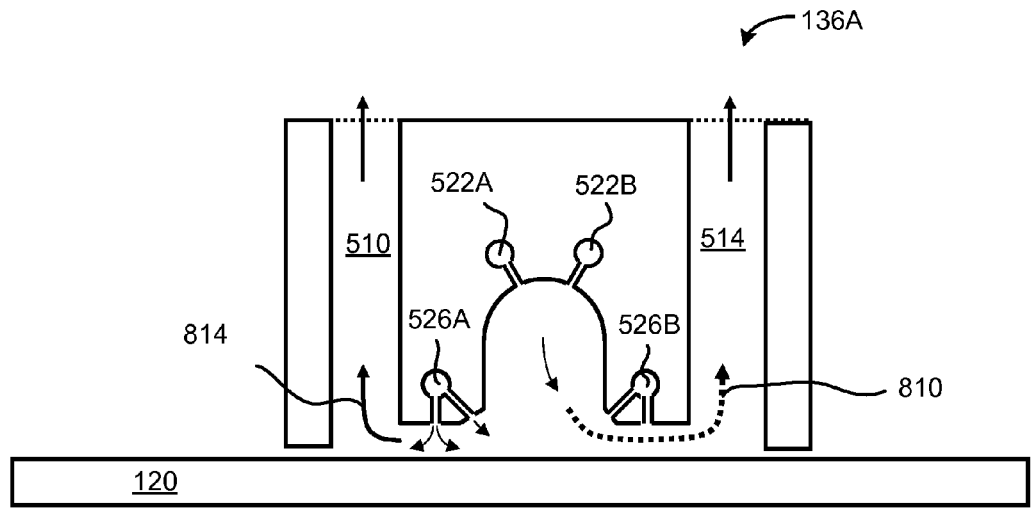
FIG. 8A is a diagram illustrating flow of gas in the injector during the injection of source precursor, according to one embodiment.

During time period $t_1$, the source precursor (TMA) is injected into the reaction chamber 520 via the channel 522A and the slits or holes 524A, and then discharged via the exhaust portion 514, as described below in detail with reference to FIG. 8A. During period $t_1$, the reactant precursor (ozone) is not injected into the reaction chamber 520 but the Argon gas is injected into the purge gas channels 526A, 526B (the amount of Argon gas injected into the purge gas channel 526A is greater than the amount of Argon gas injected into the purge gas channel 526B). FIG. 8A is a diagram illustrating flow of gas in the injector 136A during the injection of source precursor, according to one embodiment. The excess source precursor 810 is discharged via the exhaust portion 514 due to the higher volume of Argon gas injected via the purge gas channel 526A compared to the purge gas channel 526B. Part of the Argon gas 814 injected via the purge gas channel 526A is discharged via the exhaust portion 510.

Referring back to FIG. 7, the supply of the source precursor (TMA) is stopped during time period $t_2$. Instead, Argon gas is injected into the reaction chamber 520 via the channel 522A and the slits or holes 524A. Argon gas discharges the source precursor remaining in the reaction chamber 520 through the exhaust portion 514. Moreover, during this period, Argon supplied via the channel 520 (in conjunction with Argon supplied via the purge gas channels 526A, 526B) removes source precursor molecules physisorbed on the surface of the substrate 520.

Figure 8B:
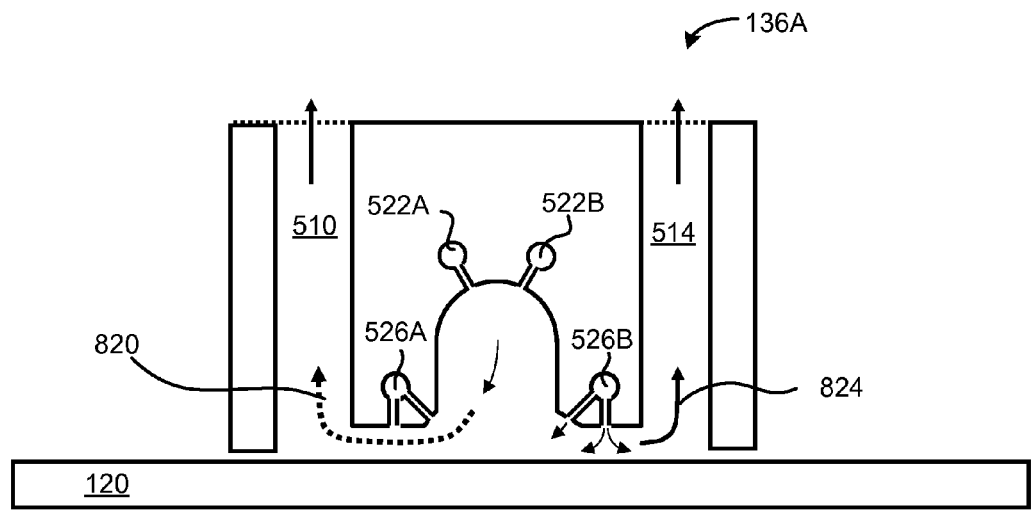
FIG. 8B is a diagram illustrating flow of gas in the injector during the injection of reactant precursor, according to one embodiment.

During time period $t_3$, the reactant precursor (ozone) is injected into the reaction chamber 520 via the channel 522B and the slits or holes 524B, and then discharged via the exhaust portion 510. FIG. 8B is a diagram illustrating flow of gas in the injector 136A during the injection of reactant precursor, according to one embodiment. The excess source precursor 820 is discharged via the exhaust portion 510 due to the higher volume of Argon gas injected via the purge gas channel 526B compared to the purge gas channel 526A. Part of the Argon gas 824 injected via the purge gas channel 526B is discharged via the exhaust portion 514.

Referring back to FIG. 7, the supply of the reactant precursor is stopped during time period $t_4$. Instead, Argon gas is injected into the reaction chamber 520 via the channel 522B and the slits or holes 524B. Argon gas discharges the reactant precursor remaining in the reaction chamber 520 through the exhaust portion 510. Moreover, during this time period, Argon supplied via the channel 520 (in conjunction with Argon supplied via the purge gas channels 526A, 526B) removes source precursor molecules physisorbed on the surface of the substrate 520. The end of period $t_4$ concludes the first cycle. In the embodiment of FIG. 7, the second cycle is repeated to deposit a second layer of $Al_2O_3$.

Figure 9A:
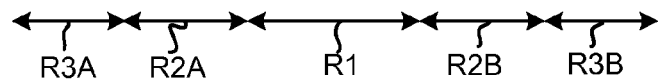
FIGS. 9A through 9E are diagrams illustrating molecules deposited on a substrate, according to one embodiment.
Figure 9B:
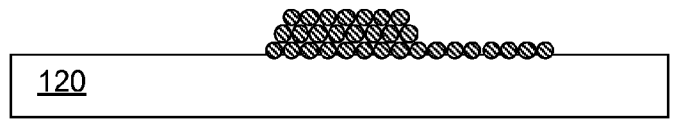

FIGS. 9A through 9E are diagrams illustrating molecules deposited on a substrate, according to one embodiment. FIG. 9A illustrates TMA molecules deposited on the substrate 120 after period $t_1$ of FIG. 7. As illustrated in FIG. 9A, some physisorbed TMA molecules (layers of TMA molecules above the first layer) remain on the reaction zone R1 and the constriction zone R2B of the substrate 120. As purge gas (Argon gas) is injected onto the substrate 120 via the channel 522A and holes or slits 524A in period $t_2$ of FIG. 7, physisorbed TMA molecules are removed from the surface of the substrate 120. Hence, after period $t_2$, a single layer of chemisorbed TMA molecules remains on the substrate 120, as shown in FIG. 9B.

Figure 9C:
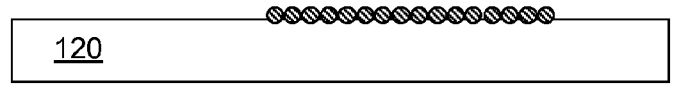
Figure 9D:
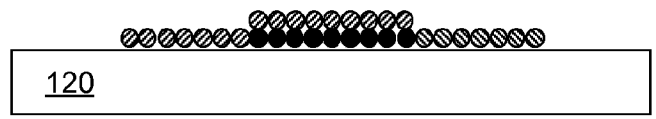

During period $t_3$, the reactant precursor (ozone) is injected onto the substrate 120. As a result, the reactant precursor reacts with the chemisorbed source precursor in the reaction zone R1 of the substrate 120 and forms a single layer of $Al_2O_3$. With further injection of reactant precursor, a layer of $H_2O$, OH or O* molecules is deposited on the surface of the substrate and on the layer of $Al_2O_3$ in the reaction zone R1 and the constriction zone R2A, as shown in FIG. 9C. As purge gas (Argon gas) is injected onto the substrate 120 via the channel 522B and holes or slits 524B in period $t_4$ of FIG. 7, physisorbed $H_2O$, OH or O* molecules are removed from the surface of the substrate 120 in the reaction zone R1. Hence, after period $t_4$, a single layer of chemisorbed TMA molecules remains on the substrate 120 in the reaction zone R1. A single layer of chemisorbed $H_2O$, OH or O* molecules also remains in the constriction zone R2A while a single layer of chemisorbed TMA molecules also remains in the constriction zone R2B of the substrate 120.

Figure 9E:
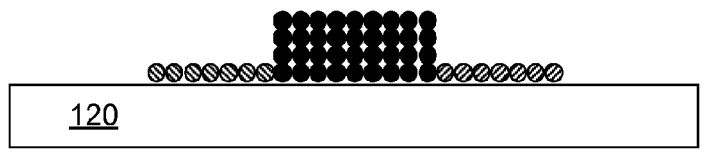

FIG. 9E illustrates subjecting the substrate 120 to four cycles of process as described above with reference to FIGS. 9A through 9D. As a result, four layer of $Al_2O_3$ is formed on the reaction zone R1 of the substrate 120 while a single layer of $H_2O$, OH or O* molecules remains in the constriction zone R2A of the substrate and a single layer of TMA molecules remains in the constriction zone R2B of the substrate 120.

Note that the injector 136A allows multiple layers of $Al_2O_3$ to be deposited on the same location of the substrate 120 without moving the substrate 120. When two or more injectors are used to inject the source precursor and the reactant precursor individually, the substrate 120 should be moved horizontally to expose the same area of the substrate 120 to different precursor molecules. In contrast, the injector 136A enables performing of ALD on a certain region of the substrate 120 without moving the substrate 120 since the same injector 136A injects both the source precursor and the reactant precursor. Hence, the injector 136A may reduce the reciprocation or the rotation of the substrate 120 to deposit the materials on the substrate 120 as well as allowing more localized deposition of materials on the substrate 120. Further, by removing additional injectors, the cost of the deposition apparatus can be reduced.

Figure 10A:
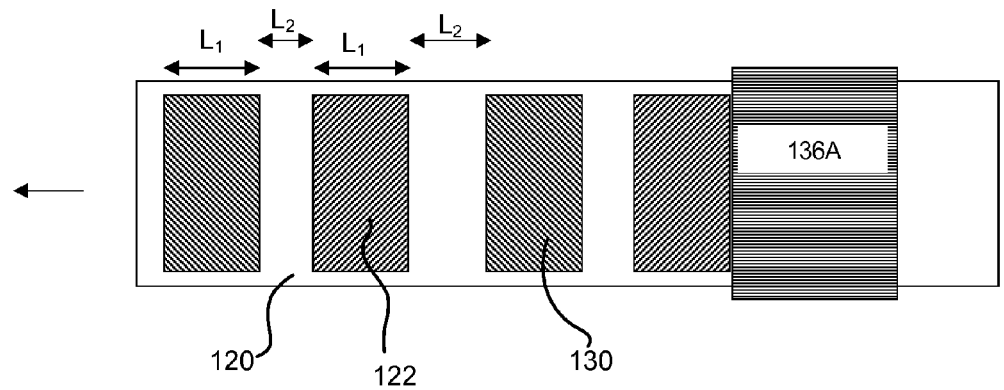
FIGS. 10A through 10C are diagrams illustrating materials deposited on the substrate depending on the speed of the substrate relative to the speed of gas switching, according to one embodiment.
Figure 10B:
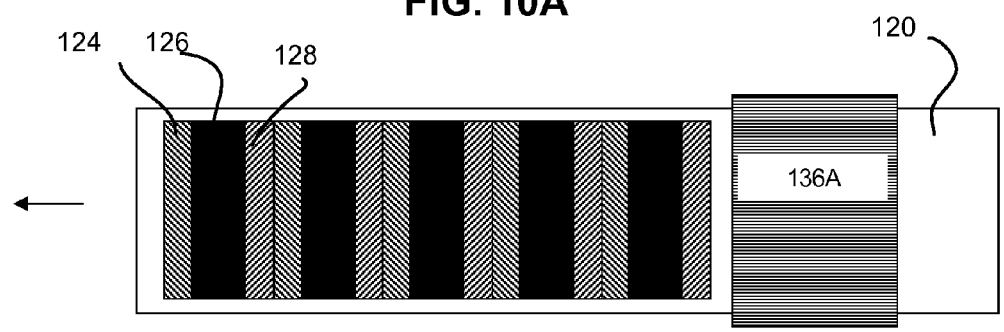
Figure 10C:

FIGS. 10A through 10C are diagrams illustrating layout of materials deposited on the substrate depending on the speed of the substrate relative to the speed of gas switching, according to one embodiment. FIG. 10A illustrates an example where the moving of the substrate 120 is not correctly timed to form an atomic layer on the substrate 120. Consequently, source precursor molecules are deposited in region 130 for a width of L1 followed by a region where no molecules are deposited for a width of L2 followed by a region 122 where reactant precursor molecules are deposited.

FIG. 10B illustrates an example where the moving of the substrate 120 is arranged so that the source precursor and the reactant precursor react within only on regions 126 of the substrate 120 marked by black boxes. The remaining regions 124, 128 of the substrate 120 are covered with either the source precursor molecules or the reactant precursor molecules.

FIG. 10C illustrates an example where substantially the entire surface 142 of the substrate 120 is subject to the source precursor and then the reactant precursor. In one embodiment, the substrate 120 is moved only after a reaction zone R1 of the substrate 120 is subject to the source precursor and the reactant precursor.

Figure 11A:
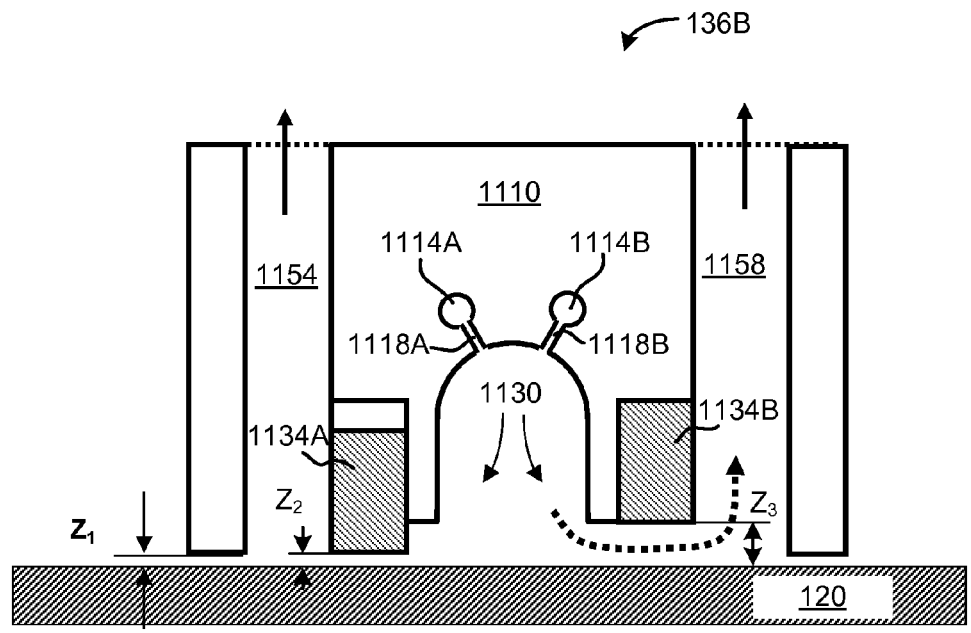
FIGS. 11A and 11B are cross sectional diagrams illustrating the injector according to another embodiment.
Figure 11B:
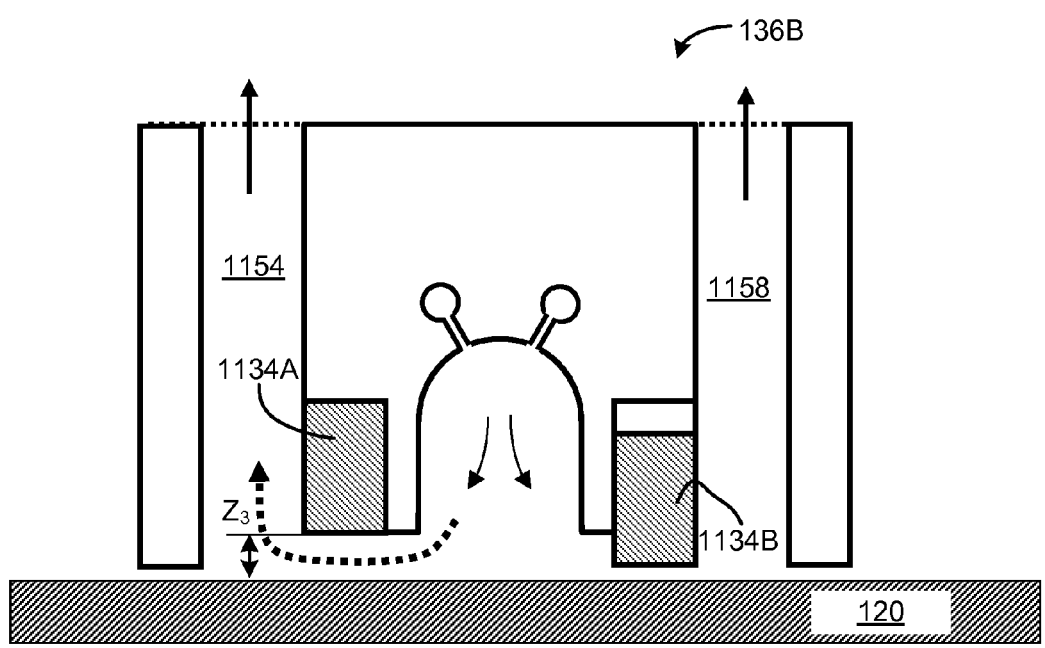

FIGS. 11A and 11B are cross sectional diagrams illustrating an injector 136B, according to another embodiment. Instead of purge gas channels and slits/holes connected to these purge gas channels, the injector 136B includes a set of shutters 1134A, 1134B that are lowered to close certain paths and route the excess source precursor or the reactant precursor to the exhaust portion 1154 or the exhaust portion 1158. Motors or other link structures for raising or lowering the shutters 1134A, 1134B are also provided but not shown in FIGS. 11A and 11B.

As shown in FIG. 11A, when the source precursor is injected into the reaction chamber 1130 via the channel 1114 and holes or slits 1118A, the left shutter 1134A is lowered. When the left shutter 1134A is lowered, the gap $Z_2$ between the substrate 120 and the shutter 1134A becomes smaller, and hence, practically closing a path from the reaction chamber 1130 to the exhaust portion 1154. Hence, only a small amount of source precursor molecules (if any) pass below the shutter 1134 and discharge via the exhaust portion 1154. The majority of source precursor molecules travels below the raised shutter 1134B (having a gap $Z_3$ with respect to the substrate 120), and discharges via the exhaust portion 1158. Subsequently, a purge gas may be injected into the reaction chamber 1130 via the channel 1114A and holes or slits 1118A to discharge the source precursor from the reaction chamber 1130.

Conversely, when the reactant precursor is injected into the reaction chamber 1130 via the channel 1114B and the holes or slits 1118B, the left shutter 1134A is raised while the right shutter 1134B is lowered. The lowering of the right shutter 1134 practically closes a path from the reactor chamber 1130 to the exhaust portion 1158, causing the excess reactant precursor to discharge via the exhaust portion 1154. Subsequently, a purge gas may be injected into the reaction chamber 1130 via the channel 1114B and holes or slits 1118B to discharge the reactant precursor from the reaction chamber 1130.

By routing the source precursor and the reactant precursor to different exhaust portions, the source precursor and the reactant precursor do not react in areas other than on the surface of the substrate. In this way, particles are not formed in the interior of the injector even when a combined injector is used to inject both the source precursor and the reactant precursor onto the substrate.

Figure 12:
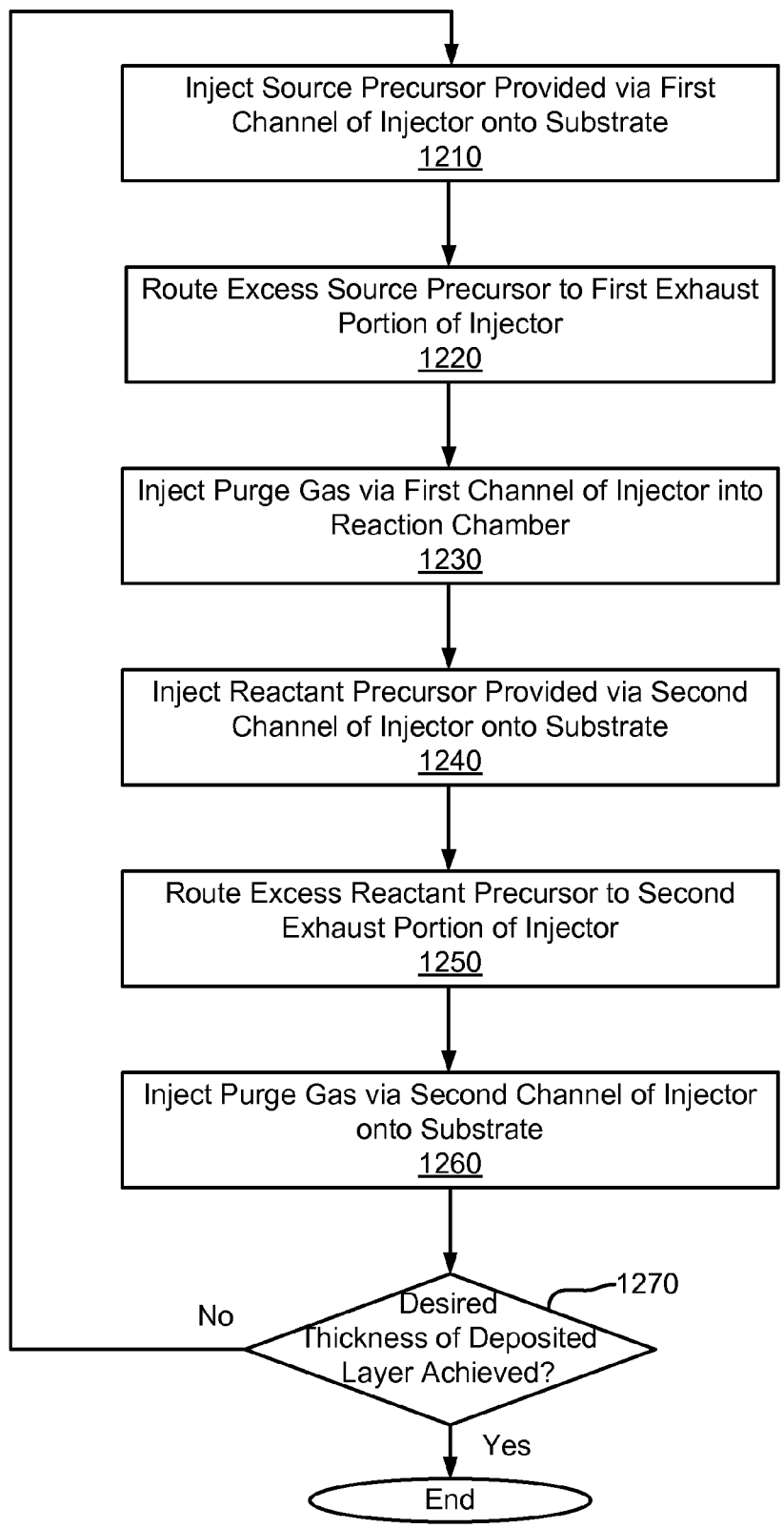
FIG. 12 is a flowchart illustrating a process of performing atomic layer depositing using a combined injector, according to one embodiment.

FIG. 12 is a flowchart illustrating the process of performing ALD using a combined injector 136A, 136B, according to one embodiment. The source precursor provided into a reaction chamber via a first channel (e.g., channel 522A, 1118A) is injected 1210 onto the substrate 120. The excess source precursor is then routed 1220 to a first exhaust portion (e.g., the exhaust portion 514, 1158) by a routing mechanism. The routing mechanism may include a purge gas channel and slits or holes connected to the purge gas channels (as described above with reference to FIGS. 6A and 6B) or a set of shutters (as described above with reference to FIGS. 11A and 11B). Purge gas is then injected 1230 into the reaction chamber via the first channel to discharge the source precursor from the reaction chamber.

The reactant precursor is then provided into the reaction chamber via a second channel (e.g., channel 522B, 1118B). The reactant precursor is injected 1240 onto the substrate 120. The excess reactant precursor is then routed 1250 to a second exhaust portion (e.g., the exhaust portion 510, 1154) by a routing mechanism. Purge gas is then injected 1260 into the reaction chamber via the second channel to discharge the reactant precursor from the reaction chamber.

It is then determined 1270 if the layer of material deposited on the substrate 120 is of a desired thickness. If the thickness of the deposited material is of a desired thickness, then the process terminates. If the thickness of the deposited material is thinner than desired, the process returns to injecting 1210 the source precursor and repeats the subsequent steps.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of depositing a layer of material on a substrate, comprising:
    injecting source precursor into a reaction chamber of an injector via a first channel formed in the injector;
    sequentially exposing different portions of the substrate to the source precursor below the reaction chamber;
    routing excess source precursor remaining after exposure of the different portions of the substrate to the injected source precursor to a first exhaust portion formed in the injector by injecting a first amount of purge gas via a first purge gas channel and a second amount of purge gas via a second purge gas channel, the first amount larger than the second amount;
    injecting purge gas via the first channel into the reaction chamber after injecting the source precursor into the reaction chamber;
    injecting reactant precursor into the reaction chamber of the injector via a second channel formed in the injector after injecting the purge gas into the reaction chamber;
    sequentially exposing the different portions of the substrate to the reactant precursor below the reaction chamber;
    routing excess reactor precursor remaining after exposure of the different portions of the substrate to the injected reactor precursor to a second exhaust portion formed in the injector by injecting a third amount of purge gas via the first purge gas channel and a fourth amount of purge gas via the second purge gas channel, the fourth amount larger than the third amount, the second exhaust portion separate from the first exhaust portion; and
    injecting a purge gas via the second channel into the reaction chamber after injecting the reactant precursor into the reaction chamber.

2. The method of claim 1, wherein the first purge gas channel is formed in a portion of the injector adjacent to the second exhaust portion, a part of the first amount of purge gas is injected through a first perforation connected to the first purge gas channel and formed in the injector to inject the part of the first amount of purge gas in a direction towards the first exhaust portion.

3. The method of claim 2, further comprising injecting another part of the first amount of purge gas towards the substrate via a second perforation connected to the first purge gas channel and formed in the injector.

4. The method of claim 1, wherein the source precursor is injected into the reaction chamber in a direction towards the first exhaust portion.

5. The method of claim 2, wherein the second purge channel is formed in a portion of the injector adjacent to the first exhaust portion, a part of the fourth amount of purge gas is injected through a second perforation connected to the second purge gas channel and formed in the injector to inject the part of the fourth amount of purge gas in a direction towards the second exhaust portion.

6. The method of claim 1, wherein the excess source precursor is routed to the first exhaust portion by closing a first shutter between the second exhaust portion and the reaction chamber.

7. The method of claim 6, wherein the excess reactant precursor is routed to the second exhaust portion by closing a second shutter between the first exhaust portion and the reaction chamber.

8. The method of claim 1, wherein the source precursor comprises Trimethylaluminium, the reactant source precursor comprises ozone, and the deposited material comprises $Al_2O_3$.

9. The method of claim 1, further comprising causing a relative movement between the injector and the substrate to deposit the material on different areas of the substrate.

10. The method of claim 1, wherein routing the excess source precursor remaining to the first exhaust portion comprises: passing the excess source precursor through a constriction zone between the reaction chamber and the first exhaust portion, a speed of the source precursor in the constriction zone higher than a speed of the source precursor in the reaction chamber.

11. The method of claim 1, further comprising injecting the purge gas via the second channel into the reaction chamber after injecting the reactant precursor into the reaction chamber.

* * * * *